United States Patent
Douts et al.

(10) Patent No.: US 8,253,477 B2
(45) Date of Patent: Aug. 28, 2012

(54) VOLTAGE BOOST CIRCUIT WITHOUT DEVICE OVERSTRESS

(75) Inventors: Benjamin A. Douts, Tewksbury, MA (US); Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 981 days.

(21) Appl. No.: 12/154,950

(22) Filed: May 27, 2008

(65) Prior Publication Data

US 2009/0295362 A1    Dec. 3, 2009

(51) Int. Cl.
G05F 1/10    (2006.01)
(52) U.S. Cl. .................. 327/536; 327/537; 327/543
(58) Field of Classification Search .................. 327/536, 327/537, 543, 581; 323/222, 223, 244, 259, 323/263, 311–313, 325; 363/59, 60, 56.03–56.12, 363/116, 121, 123
See application file for complete search history.

(56) References Cited

U.S. PATENT DOCUMENTS

| | | | |
|---|---|---|---|
| 4,016,476 A | 4/1977 | Morokawa et al. | 321/15 |
| 4,259,686 A | 3/1981 | Suzuki et al. | 307/262 |
| 5,563,548 A * | 10/1996 | Kim et al. | 327/537 |
| 6,118,326 A | 9/2000 | Singer et al. | 327/390 |
| 6,326,774 B1 * | 12/2001 | Mueller et al. | 323/222 |
| 6,356,137 B1 * | 3/2002 | Roohparvar et al. | 327/390 |
| 6,828,850 B2 | 12/2004 | Lechvalier | 327/536 |
| 7,271,626 B1 * | 9/2007 | Burinskiy et al. | 327/108 |
| 7,521,978 B2 * | 4/2009 | Kim et al. | 327/291 |
| 2003/0057469 A1 | 3/2003 | Karaki | |

FOREIGN PATENT DOCUMENTS

JP    09297997 A    11/1997

OTHER PUBLICATIONS

PCT Notification of the International Search Report and the Written Opinion of the International Searching Authority, Dated Jul. 27, 2009; for International Application No. PCT/US2009/003026.
Baker, R. Jacob; "CMOS Mixed-Signal Circuit Design"; The Institute of Electrical and Electronics Engineers, Inc.; 2002; pp. 260-261.

* cited by examiner

*Primary Examiner* — Matthew Nguyen
*Assistant Examiner* — Henry Lee, III
(74) *Attorney, Agent, or Firm* — Koppel, Patrick, Heybl & Philpott

(57) ABSTRACT

A voltage boost circuit is driven with a clock signal CLK which toggles between voltages V1 and V2. A first MOSFET is coupled between CLK and an output node OUT, and at least one additional MOSFET is coupled between OUT and a supply voltage. The first terminal of a capacitance is coupled at its first terminal to OUT, and at its second terminal to a delay circuit arranged to toggle its output to ~V2 or ~V1 a predetermined amount of time after the voltage applied to the clock signal side of the first MOSFET toggles to ~V2 or ~V1, respectively. The capacitance is charged to ~V2 when the voltage applied to the clock signal side of the first MOSFET toggles to ~V2, and OUT is increased to a voltage greater than V2 when the output of the delay circuit toggles to ~V2. The only active device junctions subjected to the boosted voltage are MOSFET well-substrate junctions, such that no active devices are overstressed.

26 Claims, 7 Drawing Sheets

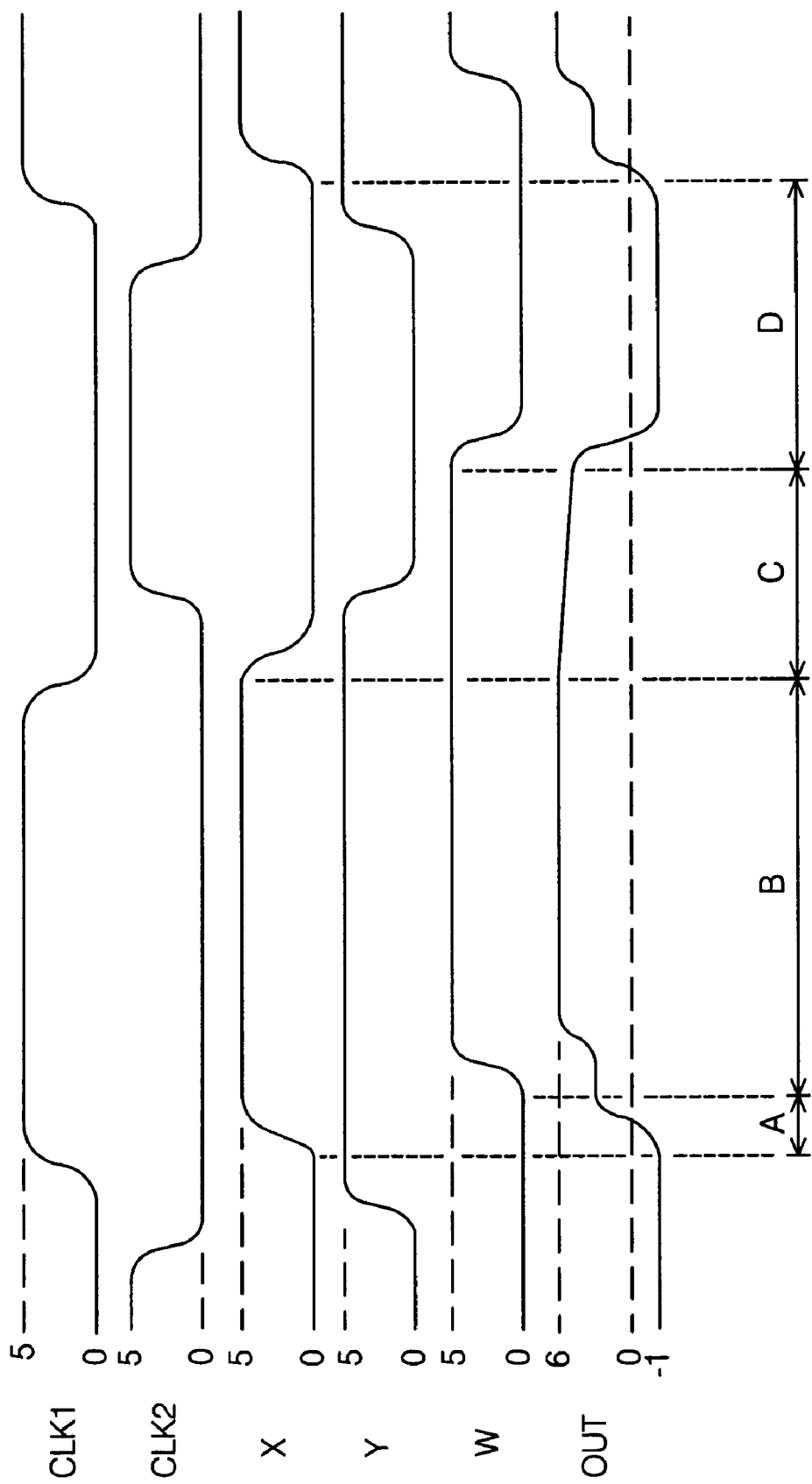

VOLTAGE BOOST CIRCUIT WITHOUT DEVICE OVERSTRESS

BACKGROUND OF THE INVENTION

1. Field of the Invention

This invention relates generally to voltage boost circuits, and, more particularly, to circuits which provide a boosted voltage without overstressing any of the circuit's active devices.

2. Description of the Related Art

An integrated circuit (IC) may require voltages having values that are higher and/or lower than the available supply voltages. This may include a voltage value which is above the positive power supply voltage, and a voltage below the lowest available negative power supply voltage (or ground).

Conventionally, signals exceeding an IC's supply voltages have been generated with complementary PMOS and NMOS devices. One such example is shown in U.S. Pat. No. 6,828,850 to LeChevalier. Here, a voltage multiplier block (106) increases the available supply voltage, which powers a level shifter (108) which includes an NMOS FET (216A). In operation, the drain of the level shifter FET is toggled between ground and the increased supply voltage. The FET must be specially designed to withstand the larger supply voltage across its drain to source; otherwise, the increased voltage may exceed the devices' maximum allowable voltage ratings, thereby overstressing the MOSFETs and possibly degrading their long term reliability.

SUMMARY OF THE INVENTION

A voltage boost circuit is presented which overcomes the problems noted above, enabling the generation of voltages both above and below an IC's available supply voltages, without overstressing any of the IC's active devices.

The present voltage boost circuit comprises a capacitance used to shift a node voltage above the positive supply voltage and/or below the negative supply voltage. MOSFETs are used to set and limit the boosted voltages, with the circuit arranged such that only the MOSFETs' well-substrate junctions are subjected to voltages exceeding the supply voltages. These junctions are typically robust enough to tolerate the boosted voltage levels.

One possible embodiment of the present voltage boost circuit is driven with a clock signal which toggles between a first voltage V1 and a second voltage V2, where V1<V2. A first MOSFET is coupled between the clock signal and an output node, and at least one additional MOSFET is coupled between the output node and a supply voltage (which can include ground). Each of the MOSFETs includes a well in which its drain, source and bulk regions reside. The first terminal of a capacitance is coupled to the output node, with the voltage boost circuit arranged such that the voltage applied to the top (clock signal side) of the first MOSFET toggles between ~V1 and ~V2 in response to the clock signal.

A delay circuit is coupled to the second terminal of the capacitance, and arranged to toggle the voltage on the second terminal to ~V2 or ~V1 a predetermined amount of time after the voltage applied to the top of the first MOSFET toggles to ~V2 or ~V1, respectively. The voltage boost circuit is arranged such that:

the capacitance and thereby the output node is initially charged to ~V2 when the voltage applied to the top of the first MOSFET toggles to ~V2 in response to the clock signal, and the output node voltage is increased to a voltage greater than V2 when the output of the delay circuit toggles to ~V2 the predetermined amount of time after the voltage applied to the top of the first MOSFET toggles to ~V2.

Similarly, the output node voltage is pulled down when the voltage applied to the top of the first MOSFET toggles to ~V1, and is decreased further—possibly to a value less than V1—when the output of the delay circuit toggles from ~V2 to ~V1 the predetermined amount of time after the voltage applied to the top of the first MOSFET toggles to ~V1.

For all embodiments, the voltage boost circuit is arranged such that the only active device junctions subjected to the boosted voltages are MOSFET well-substrate junctions, such that no active devices are overstressed.

These and other features, aspects, and advantages of the present invention will become better understood with reference to the following drawings, description, and claims.

BRIEF DESCRIPTION OF THE DRAWINGS

FIG. 6 is a timing diagram which illustrates the operation of the voltage boost circuits of FIGS. 4 and 5.

DETAILED DESCRIPTION OF THE INVENTION

Figure 1:
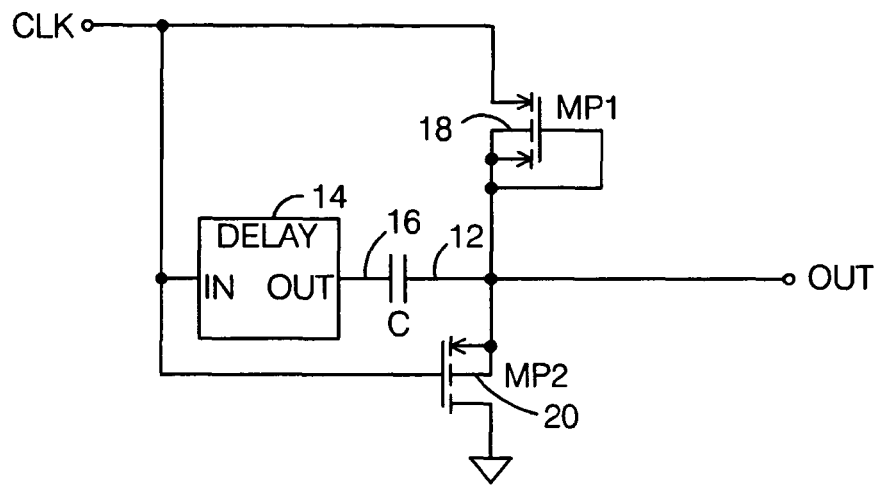
FIG. 1 is a block/schematic diagram illustrating the basic principles of a voltage boost circuit per the present invention.
Figure 2:
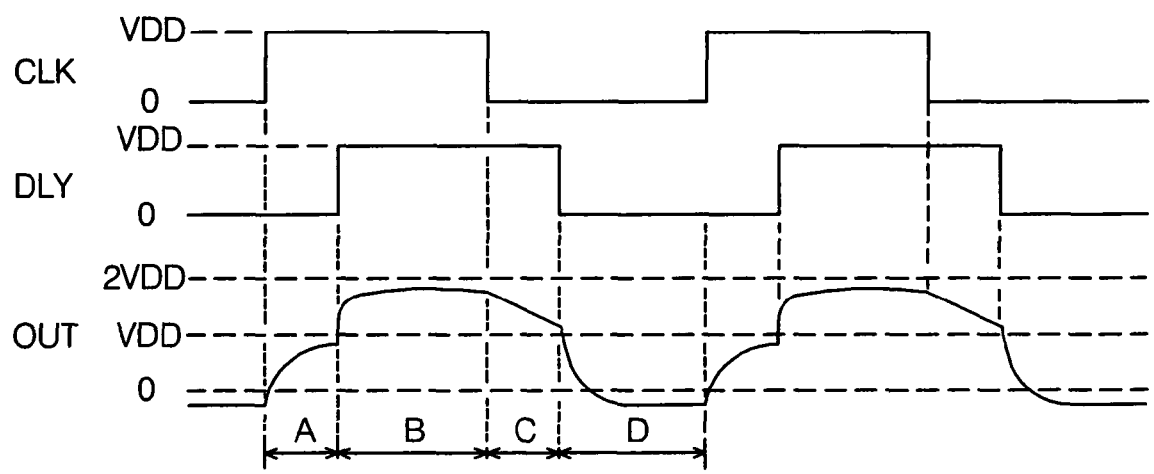
FIG. 2 is a timing diagram which illustrates the operation of the voltage boost circuit of FIG. 1.

The basic principles of a voltage boost circuit in accordance with the present invention are illustrated in FIG. 1 and the accompanying timing diagram shown in FIG. 2.

The present voltage boost circuit is driven with a clock signal CLK, which toggles between a first voltage V1 and a second voltage V2, where V1<V2. V1 and V2 would typically be available supply voltages on the IC on which the present circuit resided; in the example shown, V2 is the IC's positive supply voltage VDD and V1 is ground, though other values—including a non-zero V1 value—could also be used. The circuit includes an output node OUT, at which the boosted voltage is provided. A first MOSFET MP1 is coupled between CLK and OUT, and a second MOSFET MP2 is coupled between OUT and ground (though a non-zero voltage could also be used). Each of the MOSFETs is fabricated with a 'well' process, which provides a well in which the MOSFET's drain, source and bulk regions reside. Thus, the PMOS FETs used in this exemplary embodiment are made with an nwell process.

The first terminal 12 of a capacitance C is coupled to output node OUT. When arranged as shown, the voltage applied to the top (clock signal side) of MP1 toggles between ~VDD and ground in response to the first clock signal.

A delay circuit 14 is coupled to the second terminal 16 of capacitance C, and arranged to toggle the voltage on the second terminal to ~VDD or ground a predetermined amount of time after the voltage applied to the top of MP1 toggles to ~VDD or ground, respectively.

When arranged as shown in FIGS. 1 and 2, the voltage boost circuit operates as follows:

when CLK toggles to VDD, MP2 will be off, the drain of MP1 will be pulled up to VDD, and the source of MP1 will be at about VDD-$V_{MP1}$, where $V_{MP1}$ is the voltage drop across MP1. The voltage on second capacitance terminal 16 is low, so that C gets charged up to VDD-$V_{MP1}$. This is shown as region 'A' in FIG. 2.

when the output of delay circuit 14 toggles to ~VDD the predetermined amount of time after the voltage applied to the top of MP1 toggles to ~VDD, the voltage at OUT is increased to a voltage greater than VDD (region 'B'). The amount by which OUT exceeds VDD is limited by the gate-source voltage ($V_{gs}$) of MP2 to about 1 volt above MP2's gate voltage. MP2's gate voltage is at VDD during this interval; thus, OUT is limited by MP2 to about VDD+1v.

when CLK toggles low, the drain of MP1 and the gate of MP2 go to ground. This turns MP2 on and pulls down the voltage at OUT (region 'C').

when the output of delay circuit 14 toggles to ground the predetermined amount of time after the voltage applied to the top of MP1 toggles to ground, the voltage at OUT is pulled below ground (region 'D'). The amount by which OUT is less than ground is limited by the intrinsic nwell-substrate diode of MP1 to about −1 volt.

The bulk terminals of MP1 (18) and MP2 (20) are both connected to OUT. When so arranged, only the well-substrate junctions of MP1 and MP2 are subjected to a voltage greater than VDD or less than ground. As only the more robust nwell-substrate junctions (for these PMOS FETs) are exposed to the boosted voltages, neither MP1 or MP2 is overstressed.

Figure 3:
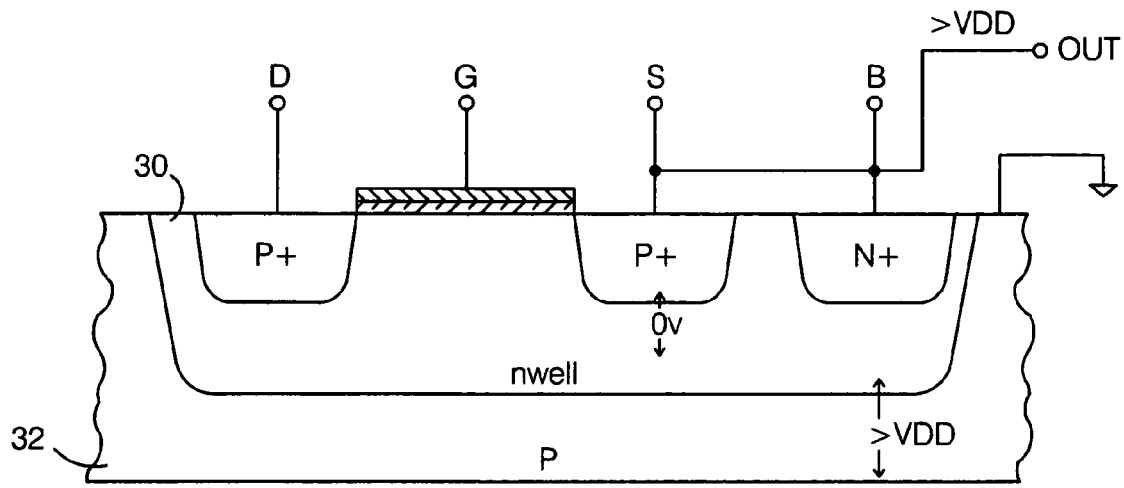
FIG. 3 is a sectional diagram of a PMOS FET, which identifies the voltage potentials to which its junctions are subjected.

This is seen more clearly with reference to FIG. 3, which is a sectional diagram of a PMOS FET as employed herein. Here, an nwell 30 is fabricated within a P-type substrate 32. As shown in FIGS. 1 and 3, the device's source and bulk terminals are connected together, and to output node OUT. Substrate 32 is at ground. However, for a PMOS FET made with an nwell process, nwell 30 effectively serves as the FET's substrate. There is a physical pn junction between the source and the nwell, but not between the source and substrate 32, because the nwell contains the source entirely. With both the source and bulk terminals being at the boosted voltage (>VDD), there is essentially 0 volts across the source-nwell junction. As such, the source terminal is not stressed. The boosted voltage is only present across the nwell-substrate junction, which is the most capable of accommodating the boosted voltage.

Figure 4:
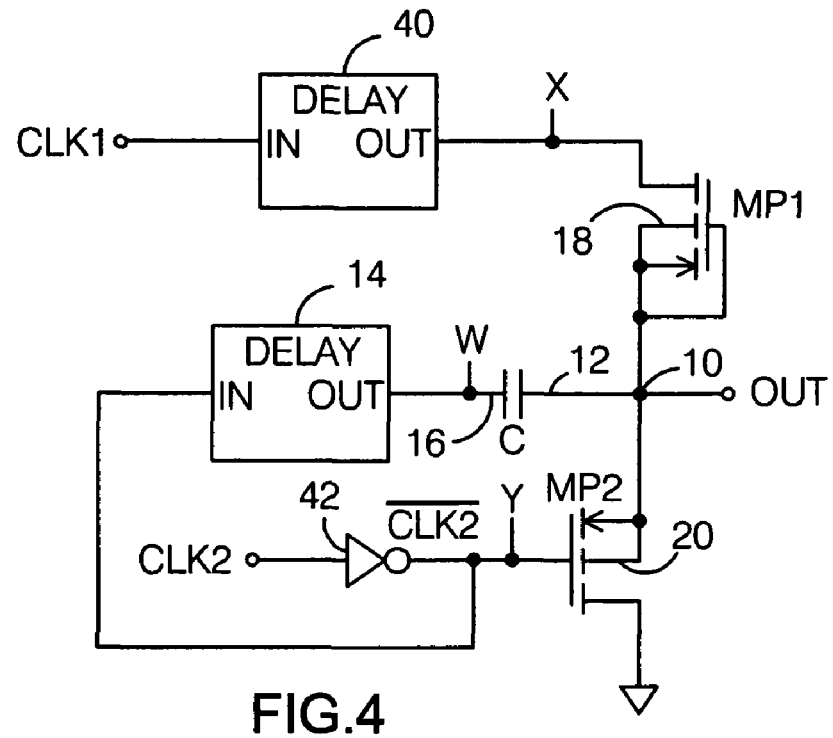
FIG. 4 is a block/schematic diagram of one possible embodiment of a voltage boost circuit per the present invention.

A more practical realization of the present boost circuit is shown in FIG. 4. As in FIG. 2, PMOS FET MP1 is connected between a clock signal (here, identified as "CLK1") and output node OUT, PMOS FET MP2 is connected between OUT and ground, and the first terminal 12 of capacitance C is connected to OUT; the bulk terminals of MP1 and MP2 are also connected to OUT. Here, however, in addition to delay circuit 14 connected in series with the second terminal 16 of capacitance C, there is a second delay circuit connected in series between CLK1 and MP1. In addition, MP2 and delay circuit 14 are here driven by the output of an inverter 42, which is driven with a second clock signal CLK2. Delay circuits 14 and 40 could be implemented in many different ways. One possible way is simply to use inverters, as shown in FIG. 5.

Figure 5:
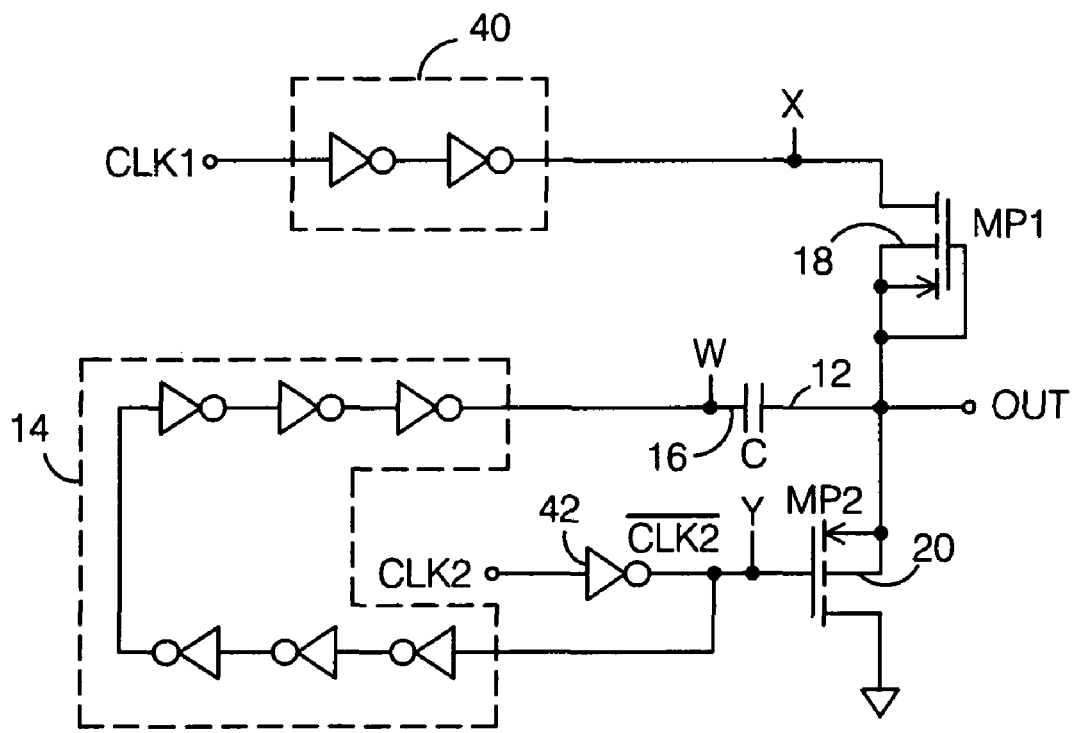
FIG. 5 is a schematic diagram of one possible implementation of the voltage boost circuit shown in FIG. 4.

The operation of a voltage boost circuit as shown in FIGS. 4 and 5 is illustrated with reference to the timing diagram shown in FIG. 6. The voltages at nodes X (drain side of MP1), Y (gate of MP2), and W (output of delay circuit 14) are shown in FIG. 6, along with CLK1, CLK2, and OUT. CLK1 and CLK2 are inverses of each other, and preferably non-overlapping such that they are never high at the same time. The diagram assumes that CLK1 and CLK2 toggle between V1 and V2, with V1 being ground and V2 being a VDD voltage of 5 volts.

When arranged as shown in FIGS. 4 and 5, the voltage boost circuit operates as follows:

when CLK1 toggles to VDD, CLK2 is low, 'Y' is high, and MP2 is off. Delay circuit 40 delays the application of CLK1 to MP1 by a predetermined amount of time. At the end of the predetermined amount of time, the drain of MP1 ('X') is pulled up to VDD, and the source of MP1 will be at about VDD-$V_{MP1}$, where $V_{MP1}$ is the voltage drop across MP1. The voltage on capacitance terminal 16 is low, so that C gets charged up to VDD-$V_{MP1}$. This is shown as region 'A' in FIG. 6.

delay circuit 14 delays the application of $\overline{CLK2}$ ('Y') to C for a predetermined amount of time after the voltage applied to first terminal 12 via MP1 toggles to VDD-$V_{MP1}$. When the output of delay circuit 14 ('W') toggles to ~VDD, the voltage at OUT is increased to a voltage greater than VDD (region 'B'). As before, the amount by which OUT exceeds VDD is limited by the $V_{gs}$ of MP2 to about VDD+1v.

when CLK1 toggles low, the drain of MP1 ('X') falls to ground. Then, when CLK2 toggles high, the gate of MP2 {'Y'} goes to ground, which turns MP2 on and pulls down the voltage at OUT (region 'C').

when the output of delay circuit 14 ('W') toggles to ground the predetermined amount of time after the voltage applied to first terminal 12 via MP1 toggles to ground, the voltage at OUT is pulled below ground (region 'D'). The amount by which OUT is less than ground is limited by the intrinsic nwell-substrate diode of MP1 to about −1 volt.

The voltage boost circuit is preferably arranged such that, when CLK1 toggles from V1 to V2, node 'Y' rises before node 'X'. This is because if 'X' rose before 'Y', MP2 would still be on and current would be conducted from 'X' to ground via MP2, thereby wasting current and degrading efficiency. Similarly, when CLK1 toggles from V2 to V1, node 'X' should fall before node 'Y', to avoid current being conducted from 'X' to ground via MP2. These relationships can be ensured with the use of non-overlapping clocks as described above. The delay times associated with delay circuits 14 and 40 should be selected so that the events described above transpire in the proper order, and to allow necessary settling to occur.

Figure 7:
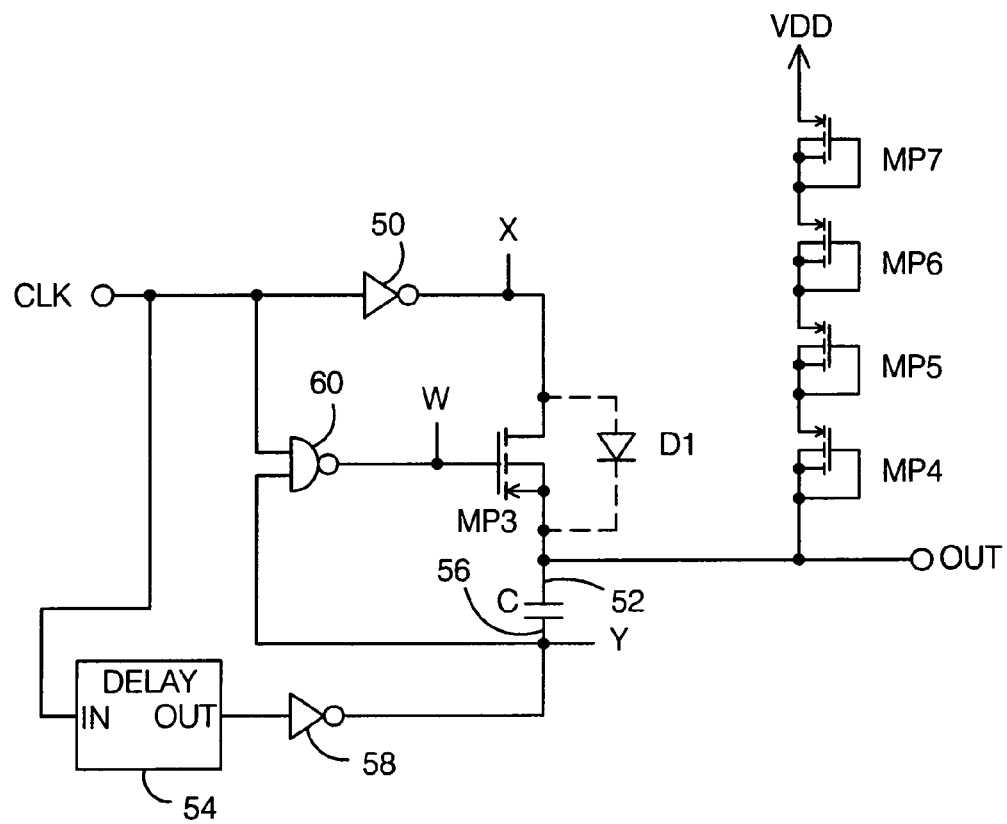
FIG. 7 is a block/schematic diagram of another possible embodiment of a voltage boost circuit per the present invention.

FIG. 7 is a block/schematic diagram of another possible embodiment of a voltage boost circuit per the present invention. Here, the circuit is driven with a clock signal CLK. CLK is applied to a MOSFET MP3 via an inverter 50, with the other side of MP3 connected to an output node OUT and the first terminal of a capacitance C. CLK is also coupled to a delay circuit 54, the output of which is coupled to the second terminal 56 of capacitance C via an inverter 58; as above, delay circuit 54 could be implemented with one or more inverters connected in series, or by any of a number of other means. A logic gate 60, a NAND gate in this example, is connected to CLK and second terminal 56 at its inputs, with its output connected to the gate of MP3. One or more MOSFETs are connected between OUT and a supply voltage—four are shown in this example: MP4, MP5, MP6 and MP7, connected between VDD and OUT.

Figure 8:
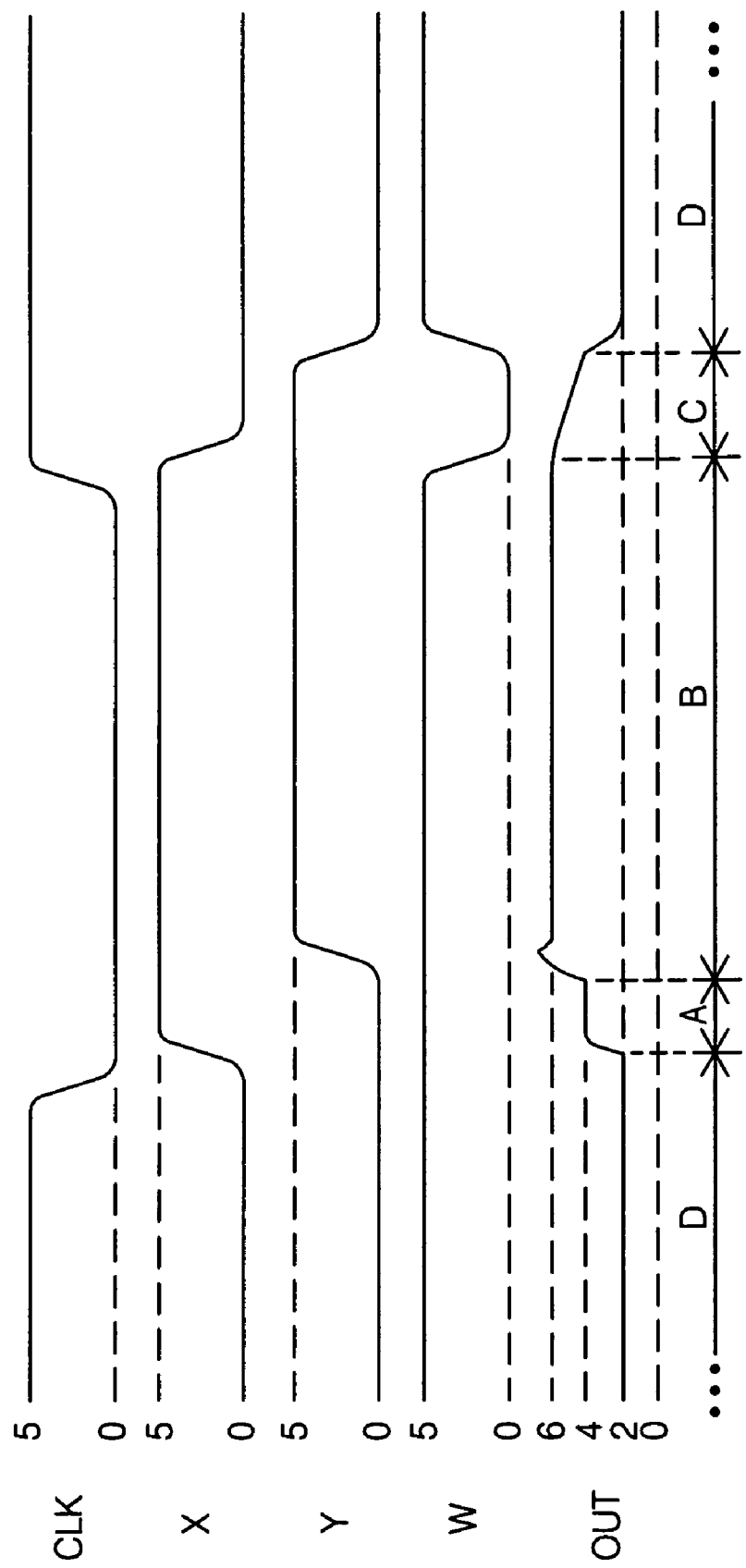
FIG. 8 is a timing diagram which illustrates the operation of the voltage boost circuit of FIG. 7.

The operation of a voltage boost circuit as shown in FIG. 7 is illustrated with reference to the timing diagram shown in FIG. 8. The voltages at nodes X (drain side of MP3), Y (second terminal of C), and W (output of logic gate 60) are shown in FIG. 8, along with CLK and OUT. The diagram assumes that the circuit is connected between a positive supply voltage (VDD) of 5 volts and ground.

An intrinsic diode D1 is present between the drain and source terminals of MP3. Initially, CLK is at VDD, nodes X and Y are at ground, node W is at VDD, MP3 is off, and OUT is at its minimum value. This value is determined by diode-connected FETs MP4-MP7. In this example, MP4-MP7 limit the negative excursion of OUT so that OUT=~2 volts.

When CLK toggles from VDD to ground, node X toggles to ~VDD, and capacitance C and thereby output node OUT are charged to ~VDD-$V_{MP3}$ via intrinsic diode D1, where $V_{MP3}$ is the voltage drop across D1. This is shown as region 'A' in FIG. 8.

The voltage at OUT is increased to a voltage greater than VDD when the output of inverter 58 ('Y') by way of delay circuit 54 toggles to ~VDD a predetermined amount of time after the voltage applied to D1 ('X') toggles to VDD (region 'B'). The voltage greater than VDD is limited by the threshold voltage of MP3, which conducts when OUT exceeds VDD+$V_{t,MP3}$, where $V_{t,MP3}$ is the threshold voltage of MP3. Output node OUT remains above VDD until the next transition of CLK.

When CLK toggles to VDD, both inputs to gate 60 are high, such that node W falls. With the gate of MP3 low, MP3 is turned on and OUT is pulled down towards $V_{t,MP3}$ (region 'C').

The voltage at node Y falls a predetermined amount of time after CLK toggles to VDD. This causes OUT to be further pulled down (region 'D'). As noted above, the negative excursion of OUT is limited by the gate-source voltages of FETs MP4-MP7; this limiting circuit could be set so that, when low, OUT is either above or below ground potential. Note that it is not essential that MP4-MP7 be implemented with MOSFETs; for example, p-n junction diodes might be used instead, in which case the negative excursion of OUT is limited by the voltage drops across the diodes.

As with the embodiments discussed above, for the circuit of FIG. 7, the bulk terminals of MP3 and MP4 are connected to OUT, and only the nwell-substrate junctions of MP3 and MP4 are subjected to a voltage greater than VDD; no transistor is stressed beyond its rated voltage limits.

The circuit of FIG. 7 is preferably arranged such that, when CLK toggles from VDD to ground, the delay imposed by delay circuit 54 is such that node X rises before node Y by an amount of time sufficient to allow capacitance C to charge up to ~VDD-$V_{MP3}$. Similarly, when CLK toggles from ground to VDD, the delay imposed by delay circuit 54 should be sufficient to allow MP3 to be turned on and C to discharge to ~$V_{t,MP3}$ before node Y falls. The delay time associated with delay circuit 54 should be selected so that the events described above transpire in the proper order, and to allow necessary settling to occur.

Figure 9:
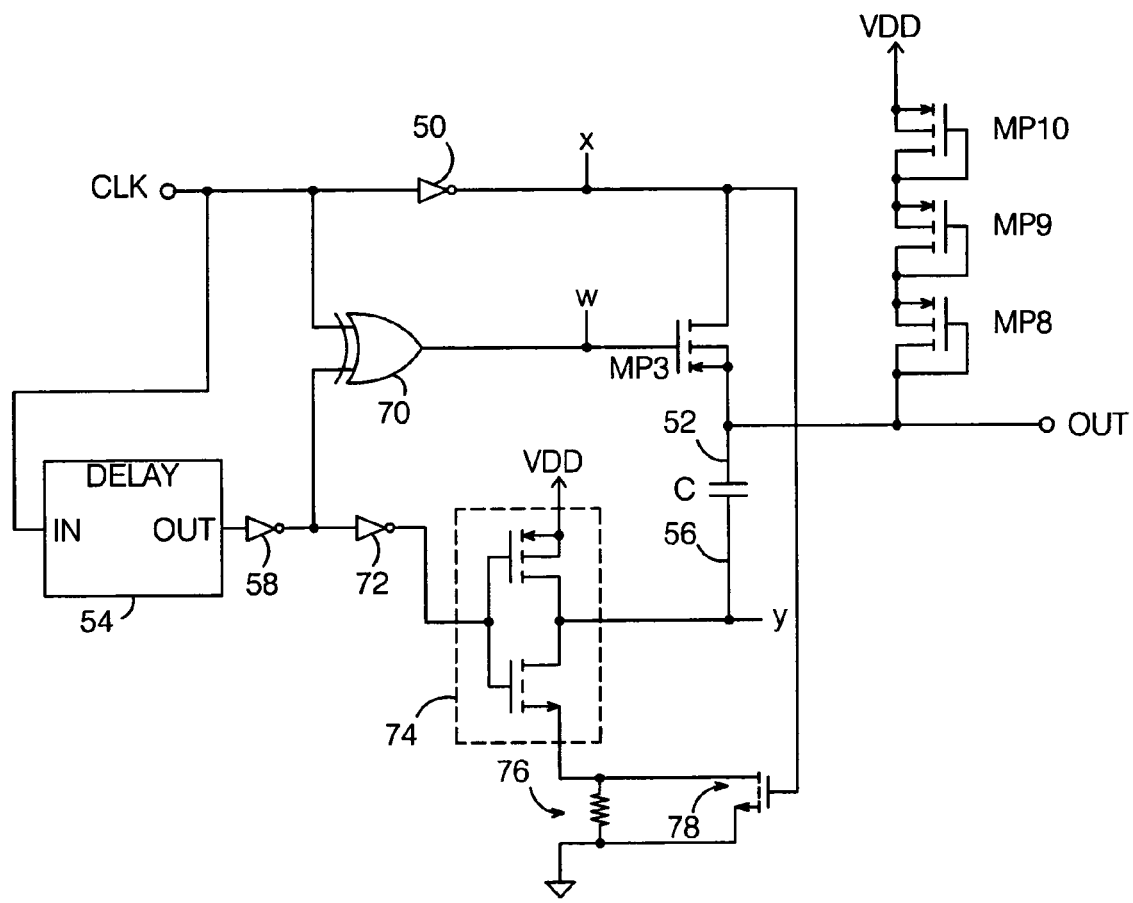
FIG. 9 is a block/schematic diagram of another possible embodiment of a voltage boost circuit per the present invention.

Another possible embodiment of a voltage boost circuit per the present invention is shown in FIG. 9. This embodiment is similar to that shown in FIG. 7, but has several additions and modifications. The present boost circuit can employ different types of logic gates; this embodiment is configured so that the logic gate is an XOR gate 70. The clamps which limit the negative excursion of OUT (MP4-MP7 in FIG. 7) can have any of a number of different configurations; for example, here, the clamps are reduced in number to three (MP8-MP10), and have their bulk terminals tied to their sources.

This embodiment also includes inverters 72 and 74, with the ground side of inverter 74 connected to ground through a resistor 76, and a switch 78 connected across the resistor. These components act to limit the undershoot of the OUT signal at its falling edge, because resistor 76 limits the rate of fall at node Y (at the end of region 'C' in FIG. 8). During charging of capacitor C (region 'A'), resistor 76 is shorted out by switch 78, thereby allowing fast charging.

Figure 10:
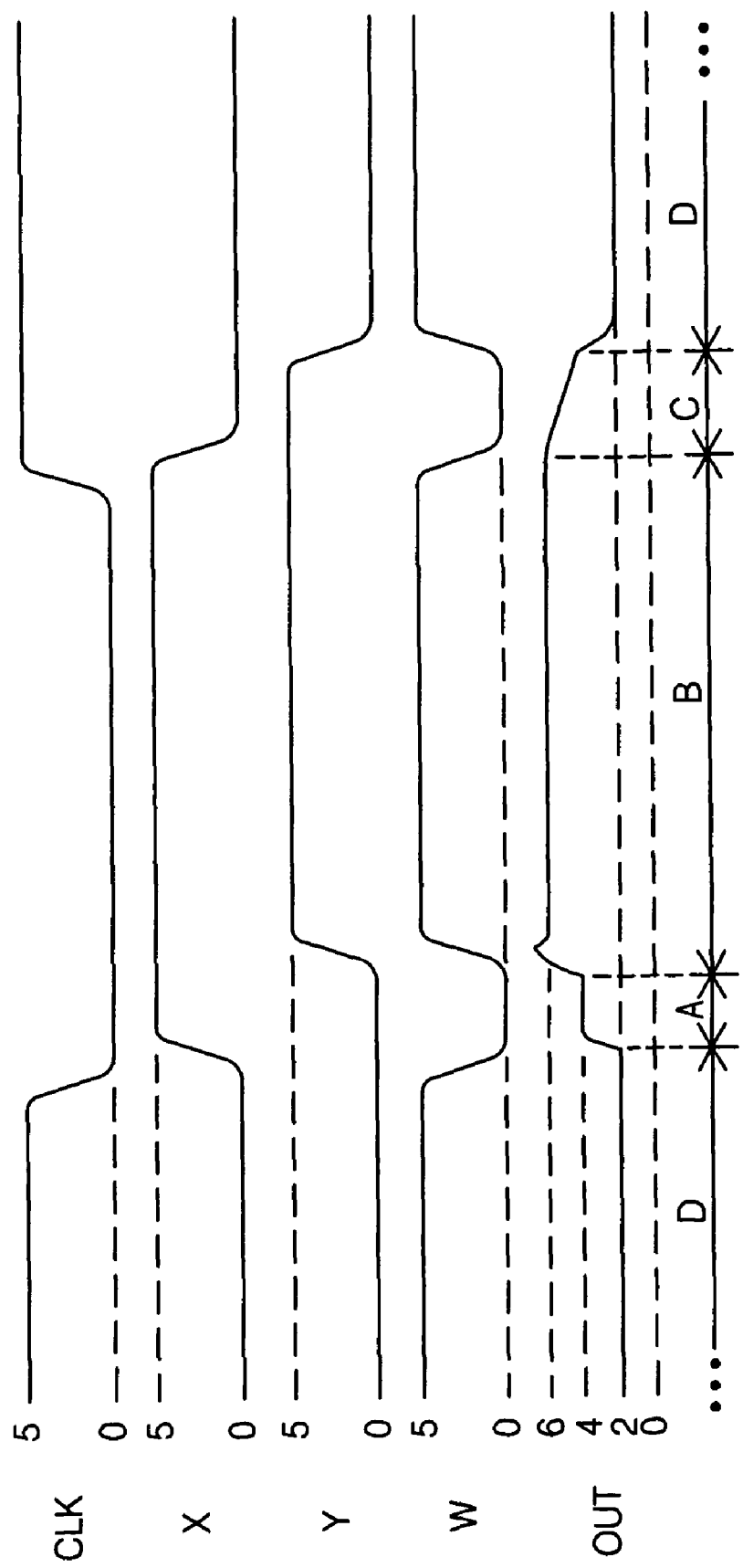
FIG. 10 is a timing diagram which illustrates the operation of the voltage boost circuit of FIG. 9.

A timing diagram for the embodiment of FIG. 9 is shown in FIG. 10. The diagram is essentially the same as that shown in FIG. 8, except that signal W now has an additional low pulse during the duration of region 'A'.

Note that, while PMOS FETs are used in the exemplary embodiments described herein, NMOS FETs made with pwells could also be used.

It should further be noted that the present invention could be implemented in many different ways; the circuits shown in FIGS. 1, 4, 5, 7 and 9 are merely exemplary. It is only essential that voltages be switched across a capacitance as needed to provide a boosted output voltage, with the circuitry arranged such that the only active device junctions subjected to the boosted voltages are the devices' well-substrate junctions.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A voltage boost circuit, comprising:
   a first clock signal which toggles between a first voltage V1 and a second voltage V2, where V1<V2;
   an output node having an associated output node voltage;
   a first PMOS FET coupled between said first clock signal and said output node, said first PMOS FET including an nwell in which its drain, source and bulk regions reside;
   a semiconductor device coupled between said output node and a supply voltage;
   a capacitance, the first terminal of which is coupled to said output node, said voltage boost circuit arranged such that the voltage applied to the top (clock signal side) of said first PMOS FET toggles between ~V1 and ~V2 in response to said first clock signal; and
   a first delay circuit which is coupled to the second terminal of said capacitance and arranged to toggle the voltage on said second terminal to ~V2 a predetermined amount of time after the voltage applied to the top of said first PMOS FET toggles to ~V2 and to toggle the voltage on said second terminal to ~V1 a predetermined amount of time after the voltage applied to the top of said first PMOS FET toggles to ~V1;
   said voltage boost circuit arranged such that:
     said capacitance and thereby said output node is initially charged to ~V2 when the voltage applied to the top of said first PMOS FET toggles to ~V2 in response to said first clock signal, and
     said output node voltage is increased to a voltage greater than V2 when the output of said first delay circuit toggles to ~V2 said predetermined amount of time after the voltage applied to the top of said first PMOS FET toggles to ~V2;

said voltage boost circuit arranged such that the junction subjected to said voltage greater than V2 is the nwell-substrate junction of said first PMOS FET.

2. The voltage boost circuit of claim 1, wherein the bulk terminal of said first PMOS FET is connected to said output node.

3. The voltage boost circuit of claim 1, wherein said semiconductor device is a second PMOS FET and said circuit is arranged such that said second PMOS FET is turned off when the voltage applied to the top of said first MOSFET is equal to ~V2, such that said voltage greater than V2 is limited by the gate-source voltage of said first and second PMOS FETs and the only junctions subjected to said voltage greater than V2 are the nwell-substrate junctions of said first and second PMOS FETs.

4. The voltage boost circuit of claim 3, wherein said circuit is arranged such that:

said second PMOS FET is turned on and pulls down on said output node voltage after the voltage applied to the top of said first PMOS FET toggles to ~V1, and said output node voltage is decreased to a voltage less than V1 when the output of said first delay circuit toggles from ~V2 to ~V1 said predetermined amount of time after the voltage applied to the top of said first PMOS FET toggles to ~V1, such that said voltage less than V1 is limited by the intrinsic nwell-substrate diode of said first PMOS FET.

5. The voltage boost circuit of claim 1, further comprising a second delay circuit connected in series between said first clock signal and said first PMOS FET such said second delay circuit receives said first clock signal and applies it to said first PMOS FET after a second predetermined delay, each of said first delay circuit's delay times being greater than said second predetermined delay.

6. The voltage boost circuit of claim 5, wherein each of said first and second delay circuits comprises at least one inverter.

7. The voltage boost circuit of claim 1, wherein said semiconductor device is a second PMOS FET, further comprising a second clock signal which toggles between a first voltage V1 and a second voltage V2, where V1<V2, said second PMOS FET coupled to said second clock signal, said first and second clock signals and said second PMOS FET arranged such that said second PMOS FET is turned off when the voltage applied to the top of said first PMOS FET is equal to ~V2 such that said voltage greater than V2 is limited by the gate-source voltage of said first and second PMOS FETs and such that the junctions subjected to said voltage greater than V2 are the nwell-substrate junctions of said first and second PMOS FETs.

8. The voltage boost circuit of claim 7, wherein said first and second clock signals are non-overlapping clocks.

9. The voltage boost circuit of claim 1, wherein said supply voltage to which said semiconductor device is coupled is ground.

10. The voltage boost circuit of claim 1, wherein said voltage V1 is approximately 0 volts.

11. The voltage boost circuit of claim 1, wherein said voltage ~V2 applied to the top of said first PMOS FET is given by V2-$V_{FET}$, where $V_{FET}$ is the voltage across said first PMOS FET.

12. The voltage boost circuit of claim 1, further comprising a logic gate arranged to turn said first PMOS FET on when the voltage at said second terminal is equal to ~V2 and the voltage applied to the top of said first PMOS FET is equal to ~V1, such that said output node voltage is pulled down toward said first PMOS FET's threshold voltage.

13. The voltage boost circuit of claim 12, wherein said supply voltage is ~V2.

14. The voltage boost circuit of claim 13, wherein said semiconductor device is a second PMOS FET which is diode-connected and connected in series between said output node and said supply voltage such that it limits the negative voltage excursion of said output node and such that the only junctions subjected to said voltage greater than V2 are the nwell-substrate junctions of said first and second PMOS FETs.

15. The voltage boost circuit of claim 1, wherein said first PMOS FET has an intrinsic diode between its drain and source terminals and said capacitance is initially charged to ~V2 via said intrinsic diode.

16. The voltage boost circuit of claim 1, further comprising circuitry coupled to the second terminal of said capacitance which limits the rate at which the voltage at said second terminal falls.

17. A voltage boost circuit, comprising:

a first clock signal which toggles between a first voltage V1 and a second voltage V2, where V1<V2;

a second clock signal which toggles between V1 and V2;

an output node;

a first PMOS FET coupled between said first clock signal and said output node;

a second PMOS FET coupled between said output node and a circuit ground point, said second PMOS FET coupled to said second clock signal, each of said PMOS FETs including an nwell in which the FET's drain, source and bulk regions reside, the bulk terminals of each of said first and second PMOS FETs directly connected to said output node;

a capacitance, the first terminal of which is coupled to said output node, said voltage boost circuit arranged such that the voltage applied to the top (clock signal side) of said first PMOS FET toggles between ~V1 and ~V2 in response to said first clock signal; and a first delay circuit which is coupled between said second clock signal and the second terminal of said capacitance, said first delay circuit and second clock signal arranged to toggle the voltage on said second terminal to ~V2 a predetermined amount of time after the voltage applied to the top of said first PMOS FET toggles to ~V2 and to toggle the voltage on said second terminal to ~V1 a predetermined amount of time after the voltage applied to the top of said first PMOS FET toggles to ~V1;

said voltage boost circuit arranged such that:

said capacitance and thereby said output node is initially charged to ~V2 when the voltage applied to the top of said first PMOS FET toggles to ~V2 in response to said first clock signal, said output node voltage is increased to a voltage greater than V2 when the output of said first delay circuit toggles to ~V2 said predetermined amount of time after the voltage applied to the top of said first PMOS FET toggles to ~V2, said second PMOS FET is off when the voltage applied to the top of said first PMOS FET is equal to ~V2 such that said voltage greater than V2 is limited by the gate-source voltage of said first and second PMOS FETs, said second PMOS FET is turned on and pulls down on said output node voltage after the voltage applied to the top of said first PMOS FET toggles to ~V 1, and said output node voltage is decreased to a voltage less than V1 when the output of said first delay circuit toggles from ~V2 to ~V1 said predetermined amount of time after the voltage applied to the top of said first PMOS FET toggles to ~V1, such that said voltage less than V1 is limited by the intrinsic nwell-substrate diode of said first PMOS FET;

such that the junctions subjected to said voltage greater than V2 are the nwell-substrate junctions of said first and second PMOS FETs.

18. The voltage boost circuit of claim 17, wherein said first and second clock signals are non-overlapping clocks.

19. The voltage boost circuit of claim 17, further comprising a second delay circuit connected in series between said first clock signal and said first PMOS FET such said second delay circuit receives said first clock signal and applies it to said first PMOS FET after a second predetermined delay, each of said first delay circuit's delay times being greater than said second predetermined delay.

20. A voltage boost circuit, comprising:
a clock signal which toggles between a first voltage V1 and a second voltage V2, where V1<V2;
an output node having an associated output node voltage;
a first PMOS FET having its drain and source terminals coupled between said first clock signal and said output node with said first PMOS FET's bulk terminal directly connected to said output node, said first PMOS FET having an intrinsic diode between its drain and source terminals, said first PMOS FET including an nwell in which the first PMOS FET' s drain, source and bulk regions reside;
at least one device coupled between said output node and a supply voltage which limits the negative excursion of said output node;
a capacitance, the first terminal of which is coupled to said output node;
a delay circuit which is coupled between said clock signal and the second terminal of said capacitance and arranged to toggle the voltage on said second terminal to ~V2 a predetermined amount of time after the voltage applied to said intrinsic diode toggles to ~V2 and to toggle the voltage on said second terminal to ~V1 a predetermined amount of time after the voltage applied to said intrinsic diode toggles to ~V1; and
a logic gate having its inputs coupled to said clock signal and to said second terminal and its output connected to operate said first PMOS FET;
said voltage boost circuit arranged such that:
said capacitance and thereby said output node is initially charged to ~V2 via said intrinsic diode when said clock signal toggles such that V2 is applied to said intrinsic diode and said first PMOS FET is held off by said logic gate;
said output node voltage is increased to a voltage greater than V2 when the output of said delay circuit toggles to ~V2 said predetermined amount of time after the voltage applied to said intrinsic diode toggles to ~V2, said voltage greater than V2 limited by the gate-source voltage of said first PMOS FET;
said first PMOS FET is turned on such that said output node voltage is pulled down toward said first PMOS FET's threshold voltage when the voltage at said second terminal is equal to ~V2 and said clock signal toggles such that ~V1 is applied to said intrinsic diode; and
said output node voltage is decreased further when the output of said first delay circuit toggles from ~V2 to ~V1 said predetermined amount of time after the voltage applied to said first terminal via said intrinsic diode toggles to ~V1;

such that the junction subjected to said voltage greater than V2 is the nwell-substrate junction of said first PMOS FET.

21. The voltage boost circuit of claim 20, wherein said logic gate is a NAND gate.

22. The voltage boost circuit of claim 20, wherein said logic gate is an XOR gate.

23. The voltage boost circuit of claim 20, wherein one of said logic gate inputs is connected to said clock signal at a first junction, further comprising an inverter connected between said first junction and said first PMOS FET such that the voltage applied to said intrinsic diode is the inverse of said clock signal, and said delay circuit is arranged such that the voltage applied to said second terminal is the inverse of said clock signal.

24. The voltage boost circuit of claim 20, further comprising circuitry coupled to the second terminal of said capacitance which limits the rate at which the voltage at said second terminal falls.

25. A voltage boost circuit, comprising:
a clock signal which toggles between a first voltage V1 and a second voltage V2, where V1<V2;
an output node having an associated output node voltage;
a first PMOS FET having its drain and source terminals coupled between said first clock signal and said output node with said first PMOS FET's bulk terminal connected to said output node, said first PMOS FET having an intrinsic diode between its drain and source terminals, said first PMOS FET including an nwell in which the first PMOS FET's drain, source and bulk regions reside;
at least one device coupled between said output node and a supply voltage which limits the negative excursion of said output node;
a capacitance, the first terminal of which is coupled to said output node;
a delay circuit which is coupled between said clock signal and the second terminal of said capacitance and arranged to toggle the voltage on said second terminal to ~V2 a predetermined amount of time after the voltage applied to said intrinsic diode toggles to ~V2 and to toggle the voltage on said second terminal to ~V1 a predetermined amount of time after the voltage applied to said intrinsic diode toggles to ~V1;
a logic gate having its inputs coupled to said clock signal and to said second terminal and its output connected to operate said first PMOS FET;
said voltage boost circuit arranged such that:
said capacitance and thereby said output node is initially charged to ~V2 via said intrinsic diode when said clock signal toggles such that V2 is applied to said intrinsic diode and said first PMOS FET is held off by said logic gate;
said output node voltage is increased to a voltage greater than V2 when the output of said delay circuit toggles to ~V2 said predetermined amount of time after the voltage applied to said intrinsic diode toggles to ~V2, said voltage greater than V2 limited by the gate-source voltage of said first and second PMOS FETs;
said first PMOS FET is turned on such that said output node voltage is pulled down toward said first PMOS FET's threshold voltage when the voltage at said second terminal is equal to ~V2 and said clock signal toggles such that ~V1 is applied to said intrinsic diode; and
said output node voltage is decreased further when the output of said first delay circuit toggles from ~V2 to ~V1 said predetermined amount of time after the voltage applied to said first terminal via said intrinsic diode toggles to ~V1;

such that only the nwell-substrate junction of said first PMOS FET is subjected to said voltage greater than V2; and circuitry coupled to the second terminal of said capacitance which limits the rate at which the voltage at said second terminal falls, wherein said circuitry comprises:

an inverter coupled to the output of said delay circuit at its input and driving the second terminal of said capacitance with its output, said inverter having power and ground terminals; and a resistor connected between said inverter's ground terminal and a second supply voltage.

26. The voltage boost circuit of claim 25, further comprising a switch arranged to provide a conductive path around said resistor when closed, said voltage boost circuit arranged such that said switch is closed while said capacitance is charging.

* * * * *